United States Patent
Jamal et al.

[11] Patent Number: 6,046,654
[45] Date of Patent: Apr. 4, 2000

[54] QUASI-GAUSSIAN FILTER

[75] Inventors: Riyaz S. Jamal; Tony Dunbar; Terrance W. Taraschuk, all of Nepean, Canada

[73] Assignee: Nortel Networks Corporation, Montreal, Canada

[21] Appl. No.: 09/033,610

[22] Filed: Mar. 3, 1998

[51] Int. Cl.$^7$ ............................. H01P 5/18; H03H 7/00
[52] U.S. Cl. .............................. 333/110; 333/167
[58] Field of Search .................. 333/109, 112, 333/116, 167, 168

[56] References Cited

U.S. PATENT DOCUMENTS

| | | | |
|---|---|---|---|
| 3,516,024 | 6/1970 | Lange | 333/116 |
| 3,571,739 | 3/1971 | Seidel | 333/117 X |
| 3,771,064 | 11/1973 | Hebert, Jr. | 333/110 X |
| 3,967,220 | 6/1976 | Tagashira | 333/109 X |
| 5,838,527 | 11/1998 | Lawrence et al. | 333/116 X |

*Primary Examiner*—Seungsook Ham
*Attorney, Agent, or Firm*—Foley & Lardner

[57] ABSTRACT

A low pass filter exhibiting low loss, low reflection, and Gaussian phase distortion characteristics at microwave and radio frequencies is provided. The low pass filter may comprise a negative feed forward network having a first directional coupler having a resonant frequency $f_o$ and a second directional coupler having a resonant frequency $f_o$, a through port of the first directional coupler being coupled to a through port of the second directional coupler, a coupled port of the first directional coupler being coupled to a coupled port of the second directional coupler, and an isolated port of the first directional coupler and an isolated port of the second directional coupler being terminated in matched loads. Additional embodiments employing multiple negative feed-forward networks are also disclosed.

15 Claims, 2 Drawing Sheets

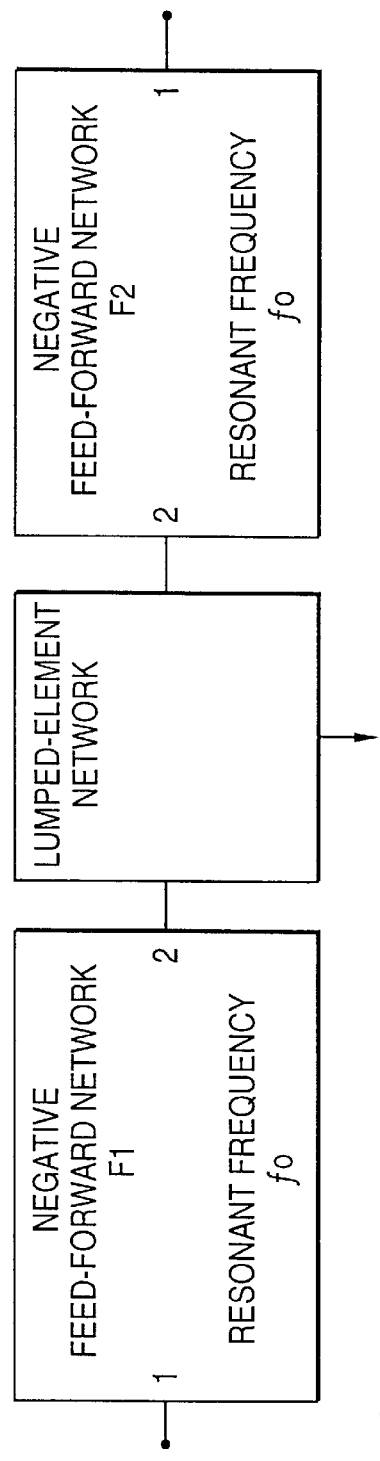
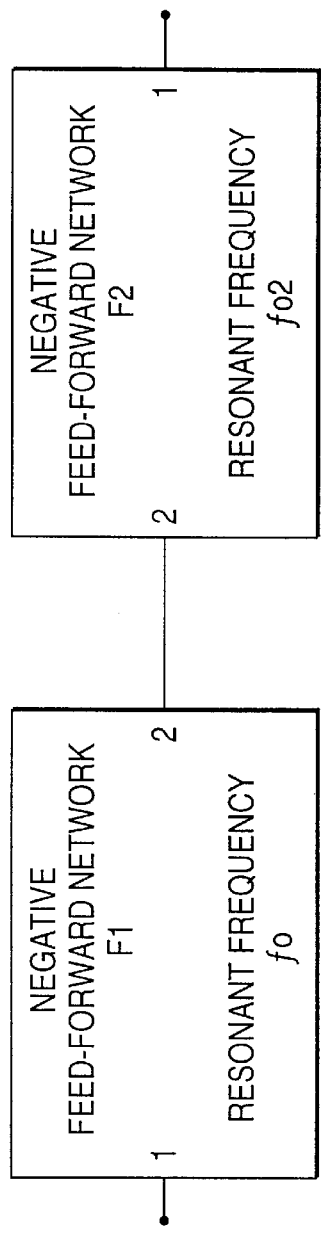
FIG. 3
$$S1 = \begin{bmatrix} 0 & k & 0 & -j\sqrt{1-k^2} \\ k & 0 & -j\sqrt{1-k^2} & 0 \\ 0 & -j\sqrt{1-k^2} & 0 & k \\ -j\sqrt{1-k^2} & 0 & k & 0 \end{bmatrix}$$
FIG. 4
$$S2 = \begin{bmatrix} 0 & 2k^2-1 & 0 \\ 2k^2-1 & 0 \end{bmatrix}$$
FIG. 5
FIG. 6

QUASI-GAUSSIAN FILTER

FIELD OF THE INVENTION

The invention pertains to the field of filters for use in digital optical communication systems. The invention addresses the problem of providing a low pass filter exhibiting low loss, low reflection, and Gaussian frequency response characteristics at microwave and radio frequencies.

BACKGROUND OF THE INVENTION

Synchronous baseband digital optical communication systems require low-pass electronic filters within transmitters for spectral shaping, and within receivers for limitation of noise bandwidth. Low pass filters having Gaussian characteristics would be desirable for these applications because they provide amplitude and phase response characteristics which minimize the distortion imparted to a pulse code modulated signal. Additionally, high bit rate SONET systems employing duobinary coding of optical phase, for example, systems employing the OC-192 protocol, may require a band-limiting filter within the duobinary encoder. Such a filter should exhibit Gaussian characteristics to minimize pulse distortion, low loss to enhance efficiency, and low reflection since the signal bandwidth entering the filter is typically twice the cut-off frequency.

Conventional low pass Gaussian filters are unable to meet the specifications dictated by the above applications because they suffer from a high voltage standing wave ratio (VSWR), i.e., high reflection. When transmission bit rates extend into microwave frequencies, reflections and the resulting standing waves generate distortion which can severely impair the communication system.

Conventional low pass, low reflection (absorptive) microwave filters are also unable to meet the specifications dictated by the above applications. Conventional low pass, low reflection microwave filters are constructed of singly terminated lossless low pass and high pass networks connected to form a diplexer. FIG. 1 illustrates the generic form of such a filter. As shown in FIG. 1, the load is connected to port 2-2' and the source is connected to port 1-1', each of which has a 50Ω real internal impedance. The high pass network absorbs power in the stop band of the low pass network to minimize reflection at the driven port 1-1'. The frequency response of the filter is determined by the frequency responses of the low pass and high pass networks. For maximally flat attenuation and Tchebyscheff filter classes, the low pass and high pass networks can be implemented using standard synthesis techniques.

It is not possible to implement Gaussian filters having maximally flat time-delay using diplexer structures because phase ripple at the crossover frequency between the low pass and high pass networks generates signal distortion. Diplexer configurations also have the disadvantage of being nonreciprocal. That is, exchanging the source and load ports does not yield the same transfer characteristic from source to load. In addition, the reflection coefficient at port 2-2' is significantly greater than that at port 1-1' since port 2-2' is not diplexed. This yields a transfer characteristic that is highly sensitive to load matching at port 2-2'. Diplexing port 2-2' would alleviate this problem, but at the expense of severely impacting the transfer characteristic.

Accordingly, conventional filter technology does not enable the implementation of a low pass filter exhibiting low loss, low reflection, and Gaussian frequency response characteristics at microwave and radio frequencies.

SUMMARY OF THE INVENTION

It is an object of the present invention to provide a low pass filter exhibiting low loss, low reflection, and Gaussian frequency response characteristics at microwave and radio frequencies.

The object is achieved in a first embodiment of the invention in a negative feed-forward network that comprises a first directional coupler having a resonant frequency $f_0$ and a second directional coupler having a resonant frequency $f_0$, where a through port of the first directional coupler is coupled to a through port of the second directional coupler, a coupled port of the first directional coupler is coupled to a coupled port of the second directional coupler, and an isolated port of the first directional coupler and an isolated port of the second directional coupler are terminated in matched loads. The feed forward network may be employed as a low pass filter. The directional couplers of the feed forward network may comprise coupled-line elements or Lange elements.

In a second embodiment, the object of the invention may be achieved in a low pass filter that comprises a first negative feed-forward network comprising two directional couplers and having a resonant frequency $f_0$, a lumped element network having an input coupled to an output of said first negative feed-forward network and having a 3 dB cut-off frequency of approximately $f_0$, and a second negative feed-forward network comprising two directional couplers. The second negative feed-forward network has an input coupled to an output of the lumped element network and has a resonant frequency of approximately $f_0$. The directional couplers of the first negative feed-forward network and the second negative feed-forward network may comprise coupled-line elements or Lange elements. The voltage coupling ratios and resonant frequencies of the directional couplers of the first negative feed-forward network and the second negative feed-forward network may be respectively provided such that a 3 dB cut-off frequency of said low pass filter is approximately no greater than $(\frac{1}{3})*f_0$.

In a third embodiment of the invention, the object of the invention may be achieved in a low pass filter that comprises a first negative feed-forward network having a resonant frequency $f_0$ and a second negative feed-forward network having an input coupled to an output of said first negative feed-forward network and having a resonant frequency $f_{02}$, where $f_{02}$ coincides approximately with a side-lobe of the output of the first negative feed-forward network for input of the first negative feed-forward network within a predetermined range. The directional couplers of the first negative feed-forward network and the second negative feed-forward network may comprise coupled-line elements or Lange elements. The voltage coupling ratios and resonant frequencies of the directional couplers of the first negative feed-forward network and the second negative feed-forward network may be respectively provided such that a 3 dB cut-off frequency of the low pass filter is approximately no greater than $(\frac{1}{3})*f_0$.

DESCRIPTION OF THE DRAWINGS

The invention will be readily understood from the written description provided herein, which makes reference to the appended figures, in which:

FIG. 3 illustrates an ideal scattering matrix of a directional coupler in accordance with the invention;

FIG. 4 illustrates a scattering matrix of a quasi-Gaussian filter in accordance with the invention in which C1 and C2 have approximately equal resonant frequencies;

FIG. 5 illustrates a low pass filter in accordance with a second embodiment of the invention; and FIG. 6 illustrates a low pass filter in accordance with a third embodiment of the invention.

DETAILED DESCRIPTION OF THE INVENTION AND PREFERRED EMBODIMENTS

Figure 1:
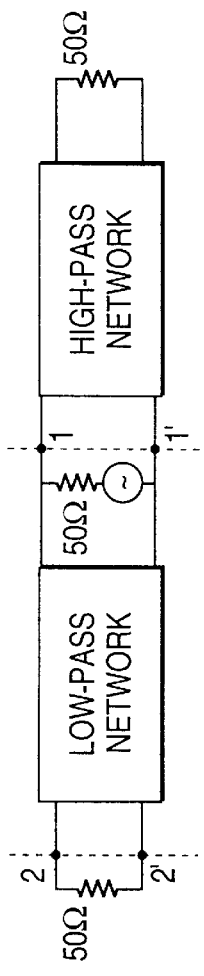
FIG. 1 illustrates a conventional low pass filter employing a diplexer configuration.
Figure 2:
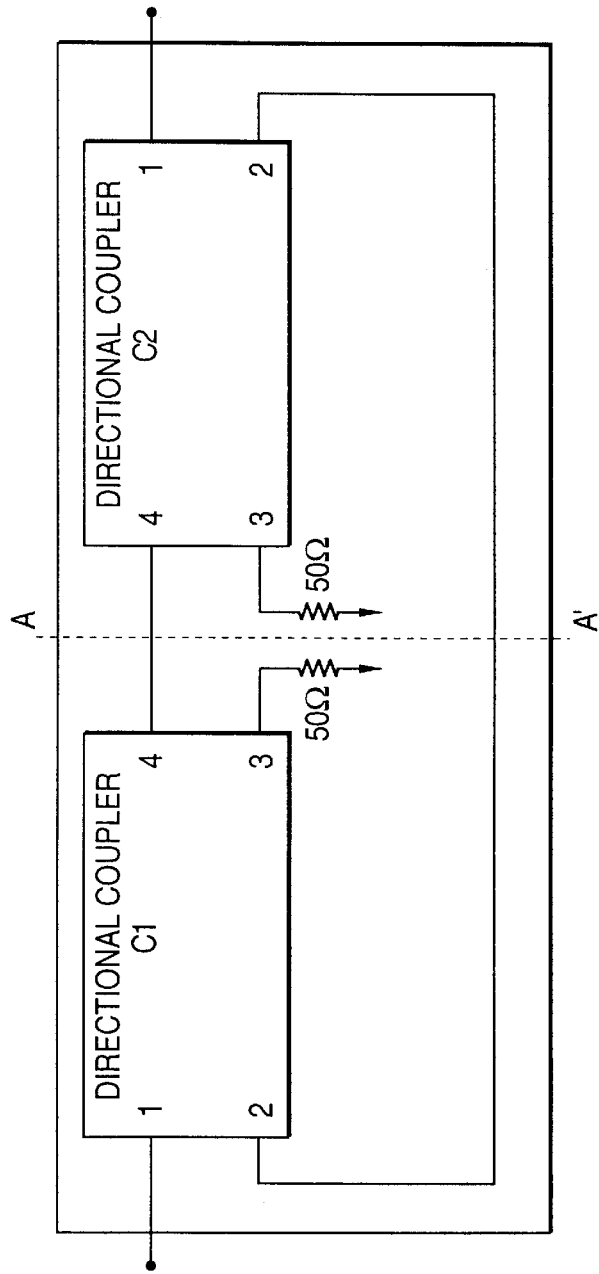
FIG. 2 illustrates a first embodiment of a quasi-gaussian filter in accordance with the invention.

Reference is made first to FIG. 2 of the drawings, which illustrates a first embodiment of a quasi-Gaussian filter in accordance with the invention. As illustrated in FIG. 2, the quasi-Gaussian filter of the first embodiment employs two directional couplers C1 and C2 as elements of a negative feed-forward network. The input port 1 of directional coupler C1 serves as the input port for the filter. The through port 4 of directional coupler C1 is coupled to the through port 4 of directional coupler C2, and the input port 1 of directional coupler C2 serves as the output port for the filter. The isolated port 3 of directional coupler C1 and the isolated port 3 of directional coupler C2 are terminated in matched loads, and the coupled port 2 of directional coupler C2 is coupled to the coupled port 2 of directional coupler C1.

For a 50Ω system, each coupler must be resonant at some frequency $f_0$, and at this frequency must ideally produce the scattering matrix as illustrated in FIG. 3. In the scattering matrix of FIG. 3, k represents the voltage coupling ratios of the directional couplers. Each coupler is, and must be, DC continuous between its input and through ports, and between its coupled and isolated ports, respectively.

In addition, both couplers C1 and C2 must have approximately the same resonant frequency; that is, resonant frequencies which are sufficiently equivalent to prevent signal degradation beyond the threshold of the specific application. With this requirement, at the resonant frequency $f_0$, the two-port feed-forward network will have the scattering matrix illustrated in FIG. 4. The equal diagonal elements of the scattering matrix of FIG. 4 indicate that the feed-forward network is inherently reciprocal at all frequencies due to the geometric symmetry about axis A-A'.

Further, for $k=2^{1/2}$, the diagonal elements $S_{21}$ and $S_{12}$ are identically zero. This is a property of the negative feed-forward network. That is, when a signal is input at the input port of the feed-forward network at the resonant frequency $f_0$, the voltage wave propagating from port 1 of C2 due to the voltage wave impinging on port 4 of C2 is 180° out of phase from the voltage coupled from port 2 of C1 to port 1 of C2. The voltage coupling ratio therefore controls the depth of the transmission loss between the input and output ports of the network at the frequency $f_0$.

For frequencies up to the resonant frequency $f_0$, the feed-forward structure has a low pass transmission characteristic between the input and output ports, with a 3 dB cut-off frequency controlled by the coupling ratio. Additionally, when the couplers within the network are implemented using coupled-line or Lange structures, the transmission phase characteristic is flat to approximately 50% of $f_0$ and the transmission amplitude characteristic is Gaussian-like to $f_0$. However, these distributed coupler structures are also resonant at odd multiples of $f_0$, resulting in the formation of side-lobes that reach their maximum transmission amplitude at even multiples of $f_0$ and degrade the low pass filter stop-band rejection. Additionally, the amplitude of the input and output VSWR of the feed-forward structure is determined by the couplers at those ports. Where coupled-line or Lange structures are employed for the directional couplers, the VSWRs are acceptable for the intended applications to $1.2*f_0$.

Second and third embodiments of the invention are preferred for optimizing stop band rejection. The second embodiment of the invention is illustrated in FIG. 5. As shown in FIG. 5, the first alternative embodiment employs two identical feed forward networks F1 and F2 of the type disclosed above. The feed forward networks are series cascaded with a low pass lumped element network between the feed forward networks for improving the stop band rejection of the cascaded feed forward networks. The 3 dB cut-off frequency of the lumped element network is selected to be approximately $f_0$. The voltage coupling ratio of the directional couplers are adjusted such that the 3 dB cut-off frequency of the overall filter of FIG. 5 is approximately $(1/3)*f_0$ or lower. The lumped-element network must be based on a maximally flat time-delay prototype to preserve a flat transmission phase characteristic to approximately 50% of $f_0$. The poor reflection characteristic of the lumped-element network near $f_0$ is masked by the feed-forward networks due to the voltage cancellation behavior of the feed-forward networks as discussed above. The filter of FIG. 5 may be designed to be reciprocal to the extent that the input and output ports may be exchanged without impairment in the intended application.

A third embodiment of the invention that is preferred for improving the stop-band rejection of the network is illustrated in FIG. 6. As shown in FIG. 6, the third embodiment of the invention employs two cascaded feed forward networks F1 and F2. Feed forward network F1 has a resonant frequency $f_0$ and feed forward network F2 has a resonant frequency $f_{02}$ which is chosen to coincide with the portion of the side-lobe of F1 that is within the spectral range of the input signal of the intended application. This configuration increases stop band rejection for frequencies greater than $f_0$. Since $f_{02}$ is necessarily greater than $f_0$, the transmission amplitude and phase characteristic of F1 are maintained. The resonant frequencies and voltage coupling ratios of F1 and F2 are chosen to yield a 3 dB cut-off frequency for the overall filter in FIG. 6 of approximately $(1/3)*f_0$ or lower, while yielding an acceptable side-lobe level. The overall filter is reciprocal in the mathematical sense, in that each of F1 and F2 is mathematically reciprocal.

The filter structures of the second and third embodiments yield, for a 3 dB cutoff frequency $(1/3)*f_0$ or lower, a Gaussian-like amplitude characteristic to frequency $f_0$, a flat phase characteristic to frequency $(1/2)*f_0$, good input and output VSWRs to $1.2*f_0$, and reciprocal performance in application. The use of distributed directional coupler structures in the filters of the second and third embodiments yield filters that can be fabricated easily for microwave frequencies using standard patterning technologies, and that are highly stable over such processes.

It is noted that in the descriptions of the embodiments provided above, many parameters of the elements of each embodiment have been described in term of exact values. It will be appreciated by those having ordinary skill in the art that in practice these values will be approximated in accordance with the capabilities of the available components and the specifications of the particular application. The invention is therefore not intended to be limited to embodiments having exact values or relationships for element parameters, but rather will vary within a range of acceptability determined by the available components and the specifications of the particular application.

Those having ordinary skill in the art will appreciate that directional couplers satisfying the various requirements set forth above may be designed at microwave resonant frequencies using Lange and parallel coupled line structures, and at RF frequencies using lumped element structures. Discussion of specific designs of these elements is therefore omitted. Teachings pertaining to the design of such elements may be found in any of the well-known texts on the subject, for example, Pozar, David M., Microwave Engineering, ISBN 0-201-50418-7, the entirety of which is incorporated herein by reference for their teachings regarding the design of directional couplers, including those satisfying the requirements discussed above.

While the above discussion has been provided to describe the basic invention and certain preferred embodiments, those having ordinary skill in the art will recognize that further alternative embodiments may be produced in accordance with the teachings in the field. The scope invention is not intended to be limited to the specific embodiments described above, but rather includes all embodiments fitting the definition provided in the appended claims, and all equivalents thereof.

What is claimed is:

1. A negative feed-forward network, comprising:
   a first directional coupler having a resonant frequency $f_0$; and
   a second directional coupler having said resonant frequency $f_0$;
   a through port of the first directional coupler being directly coupled to a through port of the second directional coupler,
   a coupled port of the first directional coupler being coupled directly to a coupled port of the second directional coupler, and
   an isolated port of the first directional coupler and an isolated port of the second directional coupler being terminated in matched loads.

2. The negative feed-forward network of claim 1, wherein said first directional coupler and said second directional coupler are comprised of coupled-line elements.

3. The negative feed-forward network of claim 1, wherein said first directional coupler and said second directional coupler are comprised of Lange elements.

4. A low-pass filter, comprising:
   a first directional coupler having a resonant frequency $f_0$; and
   a second directional coupler having said resonant frequency $f_0$;
   a through port of the first directional coupler being directly coupled to a through port of the second directional coupler,
   a coupled port of the first directional coupler being directly coupled to a coupled port of the second directional coupler,
   an isolated port of the first directional coupler and an isolated port of the second directional coupler being terminated in matched loads,
   an input port of the first directional coupler serving as an input port of the low pass filter, and
   an input port of the second directional coupler serving as an output port of the low pass filter.

5. The low pass filter of claim 4, wherein said first directional coupler and said second directional coupler are comprised of coupled-line elements.

6. The low pass filter of claim 4, wherein said first directional coupler and said second directional coupler are comprised of Lange elements.

7. The low pass filter of claim 4, wherein said frequency $f_0$ is a microwave frequency.

8. A low pass filter, comprising:
   a first negative feed-forward network comprising two directional couplers and having a resonant frequency $f_0$;
   a lumped element network having an input coupled to an output of said first negative feed-forward network and having a 3 dB cut-off frequency of approximately $f_0$; and
   a second negative feed-forward network comprising two directional couplers, said second negative feed-forward network having an input coupled to an output of said lumped element network and having said resonant frequency of approximately $f_0$.

9. The low pass filter as claimed in claim 8, wherein said directional couplers of said first negative feed-forward network and said second negative feed-forward network are comprised of coupled-line elements.

10. The low pass filter as claimed in claim 8, wherein said directional couplers of said first negative feed-forward network and said second negative feed-forward network are comprised of Lange elements.

11. The low pass filter as claimed in claim 8, wherein voltage coupling ratios and resonant frequencies of said directional couplers of said first negative feed-forward network and said second negative feed-forward network are respectively provided such that a 3 dB cut-off frequency of said low pass filter is approximately no greater than $(\frac{1}{3})*f_0$.

12. A low pass filter, comprising:
   a first negative feed-forward network having a resonant frequency $f_0$; and
   a second negative feed-forward network having an input coupled to an output of said first negative feed-forward network and having a resonant frequency $f_{02}$,
   said frequency $f_{02}$ coinciding approximately with a side-lobe of output of said first negative feed-forward network for input of said first negative feed-forward network within a predetermined range.

13. The low pass filter as claimed in claim 12, wherein said first negative feed-forward network and said second negative feed-forward network are comprised of coupled-line elements.

14. The low pass filter as claimed in claim 12, wherein said first negative feed-forward network and said second negative feed-forward network are comprised of Lange elements.

15. The low pass filter as claimed in claim 12, wherein voltage coupling ratios and resonant frequencies of directional couplers of said first negative feed-forward network and said second negative feed-forward network are respectively provided such that a 3 dB cut-off frequency of said low pass filter is approximately no greater than $(\frac{1}{3})*f_0$.

* * * * *